(12) United States Patent
Miller (10) Patent No.: US 8,183,547 B2
(45) Date of Patent: May 22, 2012

(54) DUAL BEAM SYSTEM

(75) Inventor: Tom Miller, Portland, OR (US)

(73) Assignee: FEI Company, Hillsboro, OR (US)

( * ) Notice: Subject to any disclaimer, the term of this patent is extended or adjusted under 35 U.S.C. 154(b) by 195 days.

(21) Appl. No.: 12/788,836

(22) Filed: May 27, 2010

(65) Prior Publication Data

US 2010/0301211 A1 Dec. 2, 2010

Related U.S. Application Data (60) Provisional application No. 61/181,989, filed on May 28, 2009.

(51) Int. Cl.
*H01J 37/14* (2006.01)
*H01J 37/28* (2006.01)

(52) U.S. Cl. .............. 250/492.3; 250/307; 250/309; 250/399; 250/492.21

(58) Field of Classification Search .............. 250/306, 250/307, 309–311, 396 ML, 397–399, 492.1, 250/492.21, 492.22, 492.3, 493.1
See application file for complete search history.

(56) References Cited

U.S. PATENT DOCUMENTS

| | | | |
|---|---|---|---|
| 3,131,289 A | 4/1964 | Hansen | |
| 3,699,334 A | 10/1972 | Cohen et al. | |
| 4,345,152 A | 8/1982 | Gerlach | |
| 4,701,620 A | 10/1987 | Okumura et al. | |
| 4,818,872 A | 4/1989 | Parker et al. | |
| 5,093,572 A | 3/1992 | Hosono | |
| 5,206,516 A | 4/1993 | Keller et al. | |
| 5,270,552 A | 12/1993 | Ohnishi et al. | |
| 5,376,791 A | 12/1994 | Swanson et al. | |
| 5,574,280 A | 11/1996 | Fujii et al. | |
| 5,825,038 A | 10/1998 | Blake et al. | |
| 5,990,476 A | 11/1999 | Larson et al. | |
| 6,051,839 A | 4/2000 | Crewe | |
| 6,130,432 A | 10/2000 | Pfeiffer et al. | |
| 6,218,663 B1 * | 4/2001 | Nisch et al. | 250/309 |
| 6,303,932 B1 | 10/2001 | Hamamura et al. | |
| 6,335,532 B1 | 1/2002 | Tanaka et al. | |
| 6,414,307 B1 | 7/2002 | Gerlach et al. | |
| 6,452,172 B1 | 9/2002 | Oi | |
| 6,452,173 B1 | 9/2002 | Oi | |
| 6,486,471 B1 | 11/2002 | Oi | |
| 6,515,287 B2 | 2/2003 | Notte, IV | |
| 6,538,254 B1 | 3/2003 | Tomimatsu et al. | |

(Continued)

FOREIGN PATENT DOCUMENTS

JP 59081850 5/1984

(Continued)

OTHER PUBLICATIONS

"Focused Ion Beam Technology, Capabilities and Applications," Jan. 1, 2006, http://www.fei.com/uploadedFiles/Documents/Content/2006_06_FIB_Overview_pb.pdf, 20 pages.

(Continued)

*Primary Examiner* — Bernard E Souw
(74) *Attorney, Agent, or Firm* — Scheinberg & Associates; Michael O. Scheinberg (57) ABSTRACT

A dual beam system provides for operation of a focused ion beam in the presence of a magnetic field from an ultra-high resolution electron lens. The ion beam is deflected to compensate for the presence of the magnetic field.

20 Claims, 9 Drawing Sheets

U.S. PATENT DOCUMENTS

| | | |
|---|---|---|
| 6,566,897 B2 | 5/2003 | Lo et al. |
| 6,683,320 B2 | 1/2004 | Gerlach et al. |
| 6,753,538 B2 | 6/2004 | Musil et al. |
| 6,770,867 B2 | 8/2004 | Lezec et al. |
| 6,774,379 B2 | 8/2004 | Hashimoto |
| 6,781,125 B2 | 8/2004 | Tokuda et al. |
| 6,824,644 B2 | 11/2004 | Athas et al. |
| 6,838,667 B2 | 1/2005 | Tsuneta et al. |
| 6,838,668 B2 | 1/2005 | Berger et al. |
| 6,852,982 B1 | 2/2005 | Bierhoff et al. |
| 6,855,938 B2 | 2/2005 | Preikszas et al. |
| 6,858,851 B2 | 2/2005 | Tomimatsu et al. |
| 6,900,447 B2 | 5/2005 | Gerlach et al. |
| 7,161,159 B2 * | 1/2007 | Hill et al. .......... 250/399 |
| 7,411,192 B2 | 8/2008 | Takeuchi et al. |
| 7,601,976 B2 * | 10/2009 | Hill et al. .......... 250/492.3 |
| 7,662,524 B2 | 2/2010 | Stewart et al. |
| 2003/0020016 A1 | 1/2003 | Frosien |
| 2008/0314871 A1 | 12/2008 | Toth et al. |
| 2009/0242759 A1 | 10/2009 | Bray et al. |
| 2009/0309018 A1 | 12/2009 | Smith et al. |
| 2010/0025578 A1 * | 2/2010 | Hill et al. .......... 250/307 |
| 2010/0127190 A1 | 5/2010 | Straw et al. |
| 2010/0243889 A1 | 9/2010 | Faber et al. |
| 2011/0163068 A1 * | 7/2011 | Utlaut et al. .......... 216/66 |

FOREIGN PATENT DOCUMENTS

| | | |
|---|---|---|
| JP | 1017364 | 1/1989 |
| JP | 03082110 | 4/1991 |
| JP | 3152844 | 6/1991 |
| JP | 03234417 | 10/1991 |
| JP | 3117711 | 12/1991 |
| JP | 04073847 | 3/1992 |
| JP | 06-208838 | 7/1994 |
| JP | 06318443 | 11/1994 |
| JP | 7230784 | 8/1995 |
| JP | 8115696 | 5/1996 |
| JP | 09257670 | 10/1997 |
| JP | 11-238483 | 8/1999 |
| WO | 02075806 | 9/2002 |
| WO | 2009089499 | 7/2009 |
| WO | 2010006067 | 1/2010 |
| WO | 2010006188 | 1/2010 |

OTHER PUBLICATIONS

Saghi, Zineb, et al., "Tomographic Nanofabrication of Ultrasharp Three-Dimensional Nanostructures," Applied Physics Letters, Oct. 13, 2008, 3 pages, vol. 93, No. 15.

Gnauck, Peter, et al., "A New CrossBeam Inspection Tool Combining an Ultrahigh Resolution Field Emission SEM and High Resolution FIB," 2002, pp. 833-840, vol. 4689.

J.B. Pawley, "Use of Pseudo-Stereo Techmques to Detect Magnetic Stray Field in the SEM," 1987, pp. 134-136, vol. 9.

* cited by examiner

DUAL BEAM SYSTEM

This application claims priority from U.S. Provisional Pat. App. No. 61/181,989, filed May 28, 2009, which is hereby incorporated by reference.

TECHNICAL FIELD OF THE INVENTION

The present invention relates to charged particle beam systems that include multiple charged particle beam columns.

BACKGROUND OF THE INVENTION

Charged particle beam systems are used in a variety of applications, including the manufacturing, repair, and inspection of miniature devices, such as integrated circuits, magnetic recording heads, and photolithography masks. Dual beam systems often include a scanning electron microscope (SEM) that can provide a high-resolution image with minimal damage to the target, and a focused ion beam column (FIB) that can be used for imaging or to alter substrates by milling or deposition. In most cases, the SEM and FIB are mechanically coincident, that is, the impact points of both beams are nearly identical.

One common application for a dual beam system is to expose a buried portion of a substrate and then to form an image of the exposed surface. For example, an ion beam can be used to make a vertical cut in a substrate to expose a cross-section of the layers making up an integrated surface, and then an electron beam can be scanned over the newly exposed cross-sectional surface to form an image of it. In a technique referred to as "Slice and View"™, multiple sections are sequentially exposed by the ion beam, with the electron beam forming an image of each section. Slice and View can locate and image small defects in a sample and can be used to produce three-dimensional information about the defect. Another common application of a dual beam is the extraction and thinning of a sample for viewing on a transmission electron microscope.

Figure 1:
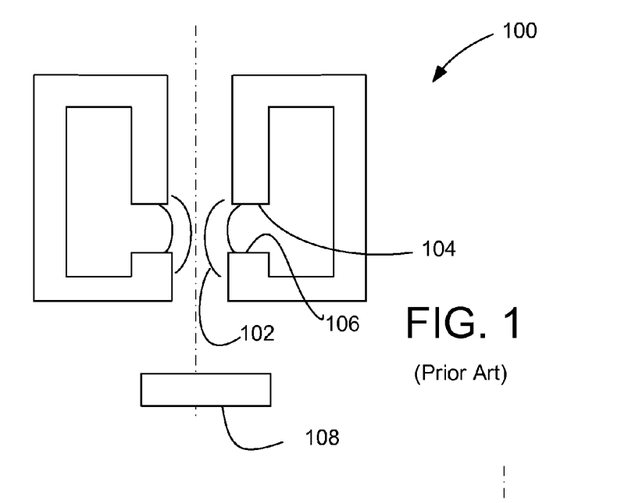
FIG. 1 shows a prior art axial gap-type electron lens for a scanning electron microscope.

A high resolution SEM can produce useful images of extremely small features, but aberrations limit the resolution. One source of aberration is "beam interaction," that is, the spreading of the electrons in the beam due to the repulsive force of the negatively charged electrons. To minimize beam interaction, the distance between the objective lens and the sample, referred to as the working distance, is typically minimized so that the electrons are crowded together for a shorter period of time. One way of reducing the working distance is to bring the magnetic field of the SEM objective closer to the sample. In one type of lens, shown schematically in FIG. 1 and referred to as an axial gap-type lens, the lens 100 produces a magnetic field 102 that extends between two lens poles 104 and 106 above a sample 108. In an axial gap lens, the focusing magnetic field is well above the sample.

Figure 2:
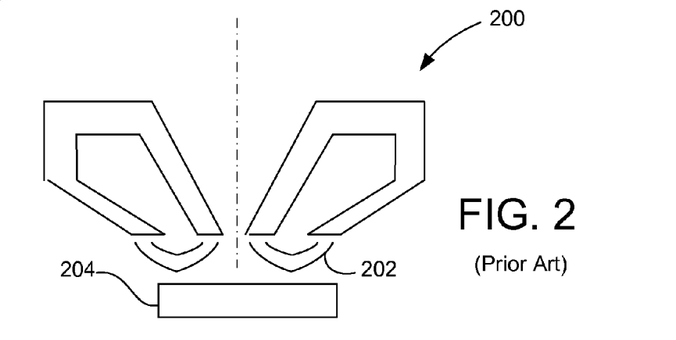
FIG. 2 shows a prior art snorkel-type electron lens for a scanning electron microscope.
Figure 3:
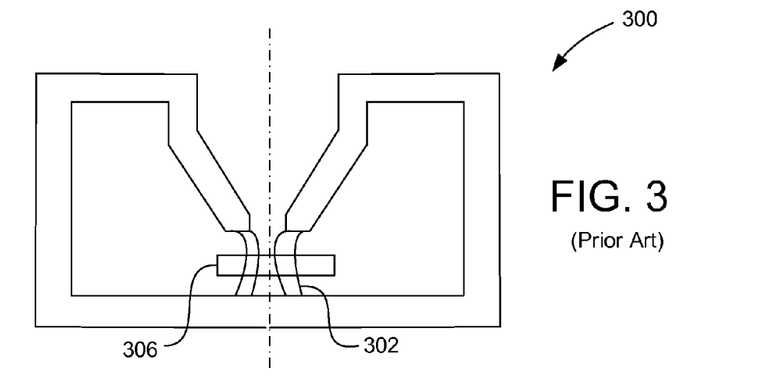
FIG. 3 shows a prior art immersion-type electron lens for a scanning electron microscope.

In another type of lens, shown schematically in FIG. 2 and referred to as a snorkel-type lens, the lens 200 is cone-shaped and the magnetic field 202 is closer to the sample 204 and so can provide better resolution. In a third type of lens, shown schematically in FIG. 3 and referred to as an immersion lens, the lens 300 produces a significant magnetic field 302, e.g., greater than about 0.025 Tesla, extending to the sample 306, providing still better resolution. The term immersion lens as used herein is not limited to any particular lens structure, but includes any lens that produces a significant magnetic field at the sample. An immersion lens is sometimes referred to as an "ultrahigh resolution lens." Operating an SEM with an immersion lens is sometimes referred to as operating in "ultrahigh resolution mode," or "UHR mode."

Figure 4:
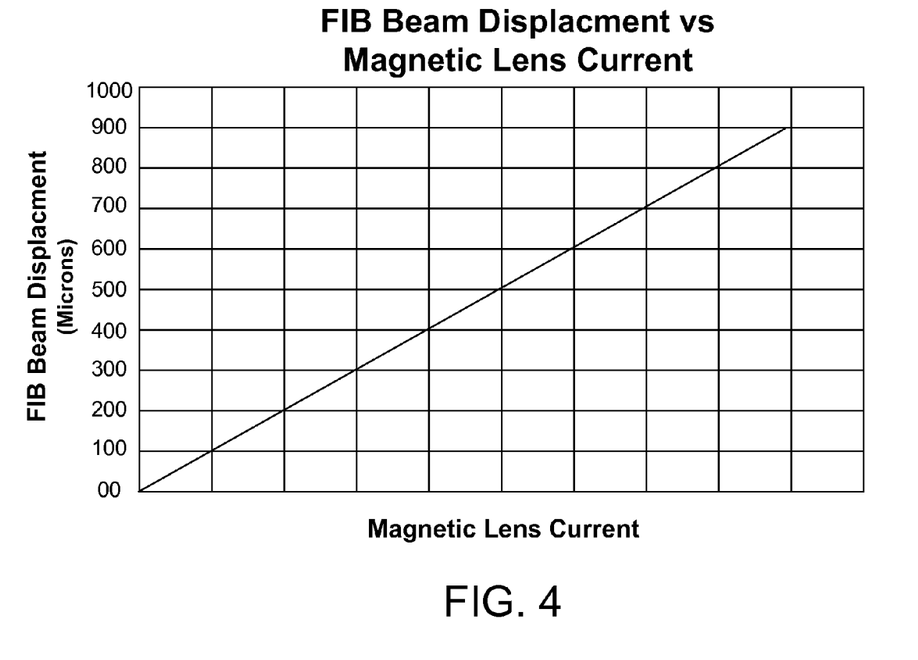
FIG. 4 is a graph showing the relationship between ion beam displacement and electron immersion lens current.

It would be desirable to be able to operate the ion beam column and the electron beam column simultaneously, or nearly simultaneously, so that SEM images could be formed rapidly as a sample is processed by the FIB. Unfortunately, the magnetic field produced by the electron lens deflects the ion beam from its intended path due to the Lorentz force on the ions. This force is in a direction perpendicular both to the magnetic field and to the velocity of the ions. Deflections, both inside and outside the ion column, caused by the magnetic field can move the impact point of the ion beam by many hundreds of microns. The deflection is particularly strong when an immersion lens is used, because a significant magnetic field extends all the way to the sample. With an energized lens operating in immersion mode, it has been impossible to operate the ion beam in a dual beam system. FIG. 4 shows the relationship between displacement of a typical FIB beam and the current in the typical magnetic lens of an electron beam column over a typical operating range. As can be seen in FIG. 4, the displacement is linear, and can be hundreds of microns.

One solution is to the deflection of the ion beam by the magnetic field is simply to not operate the electron lens in immersion mode when using the FIB, but non-immersion modes typically have lower resolution. Another solution is to switch the SEM magnetic lens off when using the ion beam and turn it back on when the electron beam is required. Turning the SEM lens on and off, however, creates additional problems. When the lens is turned off, a residual magnetic field remains and decays over time. This time dependent field changes the trajectory of the ions, making it difficult to use the FIB. The magnetic objective lens of an SEM uses significant electrical current and therefore generates a significant amount of heat, the heat being proportional to the square of the current. The heat by an SEM causes components of the dual beam system to expand. The resolution of an SEM, being on the order of magnitude of nanometers, requires a very stable physical platform and the system therefore requires a significant amount of time after being turned on to reach thermal equilibrium and become stable. As the resolution of systems has increased, stability has become more important, and longer waits are required. For example, the Slice and View technique described above requires frequent alternating between the ion beam and the electron beam. Waiting for the system to stabilize after forming each image can significantly increase processing time.

FIB columns in dual beam systems without an immersion lens have been used while the electron lens is on, but the resolution of such systems is less than that of a system with an immersion lens. U.S. Pat. No. 7,411,192 to Takeuchi et al. ("Takeuchi") describes a compensation system that employs magnetic coils in an ion column to compensate for the magnetic field of a snorkel lens. A snorkel lens, however, produces a weaker magnetic field at the sample than does an immersion lens and has lower resolution. Most ion beam systems do not include magnetic deflections lenses, and so the solution of Takeuchi requires extensively redesigning the FIB column to incorporate the magnetic lenses, and the redesign presents additional problems. Takeuchi also teaches that a compensating magnetic field can greatly reduce the separation of gallium isotopes in the beam.

Although dual beam systems with a magnetic immersion mode SEM have been available for many years, they have been unable to operate the FIB when the SEM is operating in immersion mode.

SUMMARY OF THE INVENTION

An object of the invention is to provide a system and method to facilitate the operation of a system that includes multiple charged particle beam columns.

A deflection field is applied to an ion beam to compensate for the magnetic field produced by an immersion lens for focusing an electron beam. The deflection field preferably displaces the impact point of the ions to a desired point on the sample, which point is typically the same point at which the ions would have impacted without the magnetic field of the electron lens.

The foregoing has outlined rather broadly the features and technical advantages of the present invention in order that the detailed description of the invention that follows may be better understood. Additional features and advantages of the invention will be described hereinafter. It should be appreciated by those skilled in the art that the specific embodiments disclosed below may be readily utilized as a basis for modifying or designing other structures and that such constructions are within the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

While an ion beam might be intentionally deflected to compensate for the deflection by the magnetic field of the SEM lens, deflecting a beam typically increases the aberration of the beam, that is, it disperses the beam to distort or expand the spot size of the focused beam. While ideally all ions in an ion beam have exactly the same energy, the nature of real ion sources is such that there is always a small spread of energy among the ions in the beam. Ions having different energies will be deflected differently by the magnetic field. The difference in deflection due to different energies is referred to as chromatic aberration, and causes the beam to spread out and impact different points on the target. Ions having different energies will also be deflected differently by an electrostatic field. Because the magnetic force depends on the velocity and the electrostatic force does not, the dispersion of the deflected beam in a magnetic field caused by the ion energy spread is different from the dispersion in an electrostatic field caused by the ion energy spread. Thus, when an ion beam can be deflected back to its original position by an electrostatic force, beam aberration will remain. The ion beam dispersion caused by a magnetic field can be fully compensated by another magnetic field, but as shown by the equations below, it cannot be fully compensated by the application of an electrostatic field. The actual deflection of each ion depends not only on the force, but on the time the force is acting, the direction of the force, and the distance traveled after the force is applied.

The magnetic deflection dispersion can be roughly estimated as:

$$\frac{\Delta d}{d} = \frac{1}{2}\frac{\Delta E}{E_0} \qquad \text{Eq. 1}$$

Where $\Delta d$ is the positional dispersion in the beam deflected by distance d; $\Delta E$ is the energy spread of the beam, and $E_0$ is the nominal beam energy.

Similarly, the electrostatic deflection dispersion can be roughly estimated as:

$$\frac{\Delta d}{d} = \frac{\Delta E}{E_0} \qquad \text{Eq. 2}$$

The combination of the magnetic deflection and the corrective electrostatic deflection is $$\frac{\Delta d}{d} = \frac{1}{2}\frac{\Delta E}{E_0} \qquad \text{Eq. 3}$$

Because of the large deflection caused by the magnetic immersion electron lens, it was previously considered that correction schemes would be impractical or would have seriously degraded the FIB resolution. Applicants have implemented a deflection correction system that compensates for the magnetic field of the immersion lens without significant degradation of the FIB performance. Embodiments of the invention can allow simultaneous FIB/ultra high resolution SEM operation, or an interlaced mode of operation with approximately millisecond switching time. During interlaced operation, the immersion lens preferably remains energized, with the electron beam being blanked, as the ion beam is directed toward the target. In some embodiments, the immersion is turned off when the ion beam is applied, but time must be provided for the residual magnetic field to decay sufficiently after the lens current is stopped. In a preferred embodiment, a deflection field is applied to compensate an ion beam for the magnetic field produced by an immersion lens. The invention is particularly useful for lenses that produce a magnetic field at the surface of the sample of greater than 0.025 T, greater than 0.05 T, or greater than 0.1 T. A preferred embodiment deflects the ion beam so that it passes through the ion beam objective lens near its center and deflects the beam so that the ions land at about the same point at which they would have landed in the absence of the magnetic field. The beam is also deflected to scan for imaging or processing the substrate, such as in a raster pattern.

A preferred embodiment uses two electrostatic deflectors. A first deflector is used to deflect the beam toward the center of the electrostatic objective lens of the ion column. A second deflector is used to move the beam impact point back to the point where it would have been without the magnetic field of the electron lens. The second deflector is also preferably used to scan and astigmate the beam. In other embodiments, a single deflector can both direct the beam toward the center of the objective lens, deflect the beam to compensate for the magnetic field, scan the beam in a processing pattern, and correct the stigmation of the beam. As used herein, "deflector" can refer to a single pair of parallel plates or to an assembly that includes multiple elements that each can deflect the beam, such as a sequential pair of quadrupoles or octupoles.

In a typical high resolution FIB operation, an ion beam is scanned over a range of only tens of microns at the sample surface. The dispersion of the ion beam caused by such deflection is relatively small compared to other aberrations in the beam, and so the deflection dispersion is acceptable. The deflection of the ions caused by the magnetic field from an immersion lens can be greater than 500 μm. The deflection dispersion caused by such a large deflection will be much greater.

In some embodiments, the deflection dispersion is asymmetrical, that is, the deflection alters the ion beam so that it falls off rapidly in a first direction while falling off more slowly in a direction perpendicular to the first direction. In some applications, a larger spread on one direction is acceptable, because the beam edge is still relatively sharp in the direction orthogonal to the spread. Thus, the beam can be used to process a structure requiring a sharp edge in only one direction. For example, the ion beam can be used to cut a cross section or lamella with the cut face parallel to the dispersion. Applicants have also found that the beam spread due to deflection, while being a significant portion of the spot size when a small beam current is used, is essentially averaged into the beam spot when a larger beam current is used. Thus, the dispersion is insignificant when large beam currents as typically used for milling applications, are employed.

Preferred embodiments of the present invention correct for the deflection of an ion beam caused by the deflective force in a practical and achievable manner. Because currently available ion beam systems typically include electrostatic deflectors, preferred embodiments of the present invention can be implemented with relatively minor, if any, reworking into an existing ion beam system.

A preferred embodiment addresses the deflection both within the ion column and outside the ion column, that is, between the last lens in the column and the work piece. The discussion below addresses the deflection of the FIB beam in two regions: (1) Within the column; and (2) external to the column. Skilled persons will recognize that separation of the problem into "within column" and "outside column" facilitates discussion, but is somewhat artificial and deflections within the column affect the trajectory outside the column.

Within Column Correction: The magnetic field created by a magnetic immersion SEM will, unless shielded, created a deflection of the beam within the interior of the FIB column. In some embodiments, magnetic shielding material such as "mu-metal" (a Ni—Fe alloy) is used to shield the ion beam within the FIB column from the magnetic field of the electron objective lens. Such shielding reduces the deflection of the ions caused by the magnetic field, but the reduction is insufficient for many applications. In some applications, the shielding may be impractical or will interfere with operation of the magnetic immersion mode of the electron lens. The within column deflection can be further compensated by using an upper-column deflector inside the FIB column and applying a correction deflection so as to deflect the FIB beam back toward the approximate center of the final FIB objective lens.

External Column Correction: The magnetic field created by a magnetic immersion SEM, will produce a very large deflection at the sample plane, which deflection moves the FIB beam out of coincidence with the SEM beam. Deflections can be greater than 500 μm in some situations. To correct the deflection by the magnetic field, a deflection system is provided to produce the necessary beam shift at the sample plane so as to correct for the magnetically-induced deflection from the SEM immersion-mode magnetic field. This correction is achieved in one preferred embodiment by a mid-column deflector, typically with a pivot point in (or near) the lens plane of the FIB objective lens. The term "mid-column deflector" refers to any detector that is positioned between the ion source and the objective lens. The deflection can also be achieved by a dedicated deflector below the FIB objective lens, or by a combination of deflectors above and below the objective lens.

Figure 5:
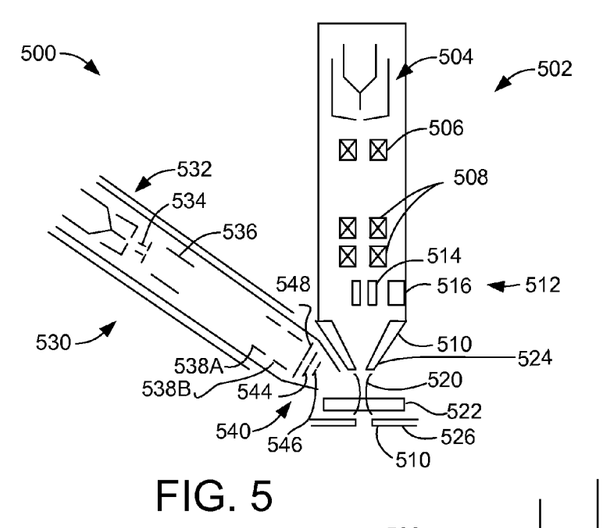
FIG. 5 a preferred embodiment of a dual beam system of the present invention.

FIG. 5 shows a dual beam system 500 that includes an electron beam column 502 including an electron gun 504, a condenser lens 506, deflectors 508, and an objective lens, such as immersion lens 510, the upper and lower poles of which are shown, with the connectors omitted for clarity. Electron beam column 502 also includes a through-the-lens secondary electron detector, 512, that includes a selective deflector, such as Wien filter 514, that deflects the secondary electrons passing through the object lens 510 toward a secondary electron detector 516, such as a scintillator-photomultiplier ("Everhart-Thornley detector"), a multi-channel plate ("MCP"), or a continuous dynode electron multiplier ("CDEM"). A magnetic field 520 extends through a sample 522 between upper pole piece 524 and a lower pole piece 526 of lens 510. Sample 522 is positioned on a tiltable X-Y stage and the shapes of lenses 510 and 540 are such as to permit sufficient tilt so that the sample can be oriented normal to either beam.

An ion column 530 includes an ion source 532, a blanker 534, an upper column electrostatic deflector 536, lower-column deflectors 538A and 538B and an electrostatic objective lens 540. Upper column deflectors 536 can be, for example, a first set of parallel plates to deflect the beam in the x-direction and a second set of parallel plates, orthogonal to the first set, to deflect the beam in the y-direction. Each plate in the set would typically have an applied potential of the same magnitude, but a different sign. Deflectors 536 could also comprise a single or a pair of octupoles or quadrupoles. A primary function of the upper column deflector is to send the ion beam toward the center of the objective lens. By "toward the center" is meant that the beam is deflected to pass closer to the center than it would have on its pre-deflection trajectory. It is desirable for the beam to pass through the final ion lens as close as possible to the center to minimize aberration. Lower column deflectors 538A and 538B then scan the beam in its processing pattern, compensate for the magnetic field outside the ion column, and correct for stigmation. In embodiments such as the one in FIG. 5 using an upper column deflector and a lower column deflector, it is the combination of deflections, not necessarily the deflection from the upper-column deflector alone, that determines the point at which the ion beam crosses the objective lens. Some embodiments eliminate upper-column deflector 536 and use deflectors 538A and 538B to both scan the beam and to compensate for the magnetic field, both inside and outside the ion column. Other embodiments, described in more detail below, may use mid-column deflectors to direct the ion beam toward the center of the objective lens and then use a deflector below the ion objective lens to scan the beam and correct for the magnetic field outside the column. The invention is not limited to any specific deflector configuration, and the functions performed by the deflectors, that is, scanning and compensating for the magnetic field, both inside and outside the column, may be performed by any of the deflectors or any combination of the deflectors.

The voltage required on the upper column deflector 536 will vary with the ion energy, the geometry of the column, and the current in the electron lens. In one embodiment, each ampere of current in the electron lens causes a displacement of the about 150 μm in the beam position at the FIB objective lens, and a deflector voltage of about 4 volts is required on the upper-column deflector for each ampere of current in the immersion lens to recenter the FIB on the objective lens. Skilled persons will be able to determine the appropriate voltage by directing the ion beam toward a sample and observing the position and shape of the spot milled in the sample. Electrostatic objective lens 540 is preferably a unipolar or "einzel" lens, having a center electrode 544 at a high voltage, such as 30,000 volts, with the two surrounding electrodes 546 and 548 being maintained at ground potential.

Figure 6:
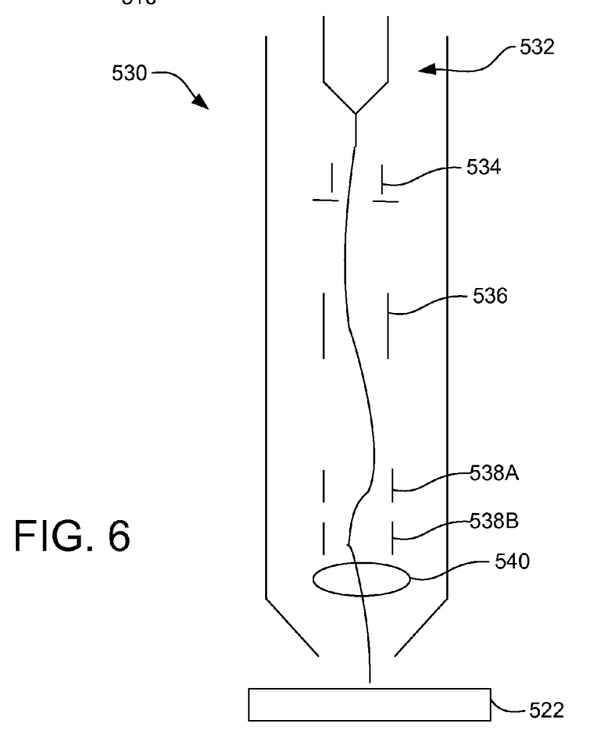
FIG. 6 shows a path of ions through the preferred embodiment of FIG. 4.
Figure 7:
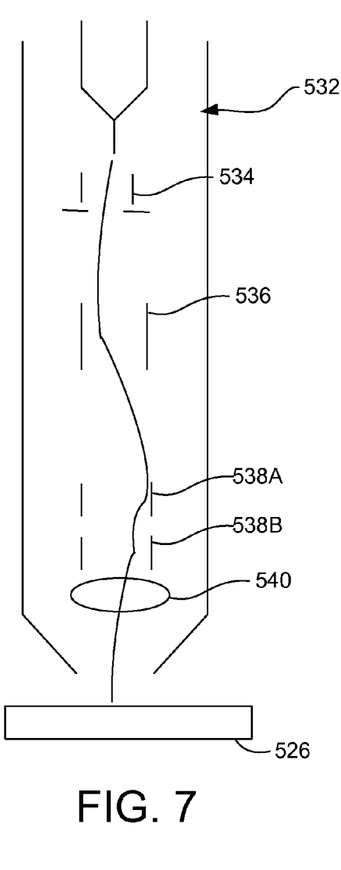
FIG. 7 shows another path of ions through the preferred embodiment of FIG. 4.
Figure 8:
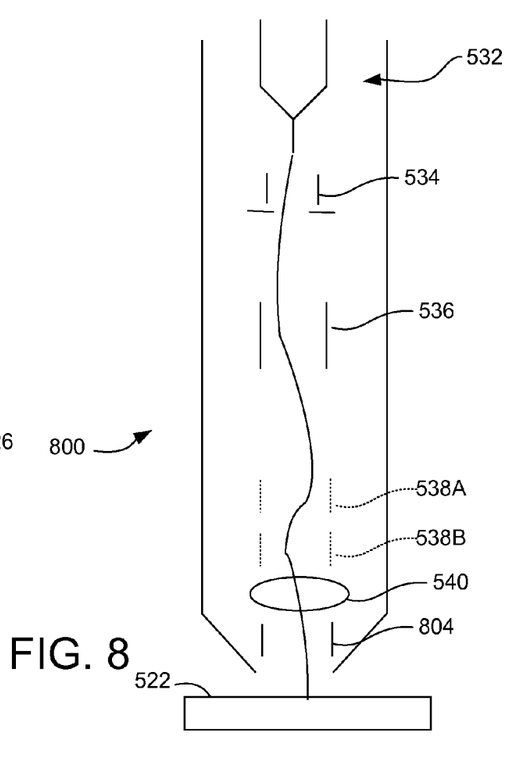
FIG. 8 shows an alternative embodiment of a dual beam system of the present invention using a post lens deflector.

FIGS. 6, 7, and 8 show stylized paths of ions through various ion columns embodying the invention. The columns are shown schematically for clarity and the deviation of the beam from the optical axis is exaggerated. Skilled persons will recognize that the deflection of ions in the upper column, away from the magnetic lens, is relatively small. FIG. 6 shows that the upper-column electrostatic deflector 536 deflects the ion beam onto a trajectory so that it will pass near the center of objective lens 540 in the absence of deflectors 538A and 538B. Preferably, the new trajectory would cause the ions, as deflected by the magnetic field in the column, to go through the center of the objective lens 540. The lower deflectors 538A and 538B deflect the beam toward the desired impact point on the sample. In an alternate embodiment, shown in FIG. 7, lower deflectors 538A and 538B are operated to deflect the beam in the same direction, rather than in opposite directions as shown in FIG. 6.

Lower deflectors 538A and 538B may operate, as is known in the prior art, by first deflecting the beam in one direction and then deflecting the beam back in the opposite direction so that the beam goes through the center of lens 540, thereby reducing aberration. Lower deflectors 538A and 538B also perform the function of scanning and de-stigmating the beam, as well as deflecting the beam to compensate for the magnetic field outside the ion column from the immersion lens 510. While a single deflector can be used for all purposes, the electronics driving the defector must be able to provide sufficient voltage on the deflector to provide for the large compensation deflection, as well as for the scanning deflection and for stigmation. In one embodiment, the deflector is capable of scanning the beam in a scan pattern over 100 μm and displacing the pattern by 500 μm to compensate for the magnetic field shift, while still retaining sufficient capacity to stigmate the beam.

It is desirable to have the "pivot point" of the beam from deflectors 538A and 538B, that is, the point of deflection, near the objective lens, so that the beam, after being directed toward the center of the objective lens by the upper-column deflector 536, will pass near the center of the objective lens 540.

FIG. 8 shows an alternate embodiment including an ion column 800 that uses a deflector 804 positioned after the final lens 540. Deflector 804 can be used in addition to the above-lens lower column deflectors 538A and 538B or in place of the above-lens lower column deflector. Deflectors 538A and 538B are shown in dashed lines to indicate that they are optional. For example, the upper-column 536 deflector can be used to direct the ion beam toward the center of the final lens, and the beam can be deflected to the desired spot on the sample using deflector 804 after the final lens 540. An advantage of placing the deflector after the final lens is that the deflection will not displace the beam from the center of the lens, while a disadvantage of the post-lens deflection is the increased working distance typically required to place the deflector between the lens and the work piece. A combination of pre- and post-lens deflectors can be used.

Figure 9:
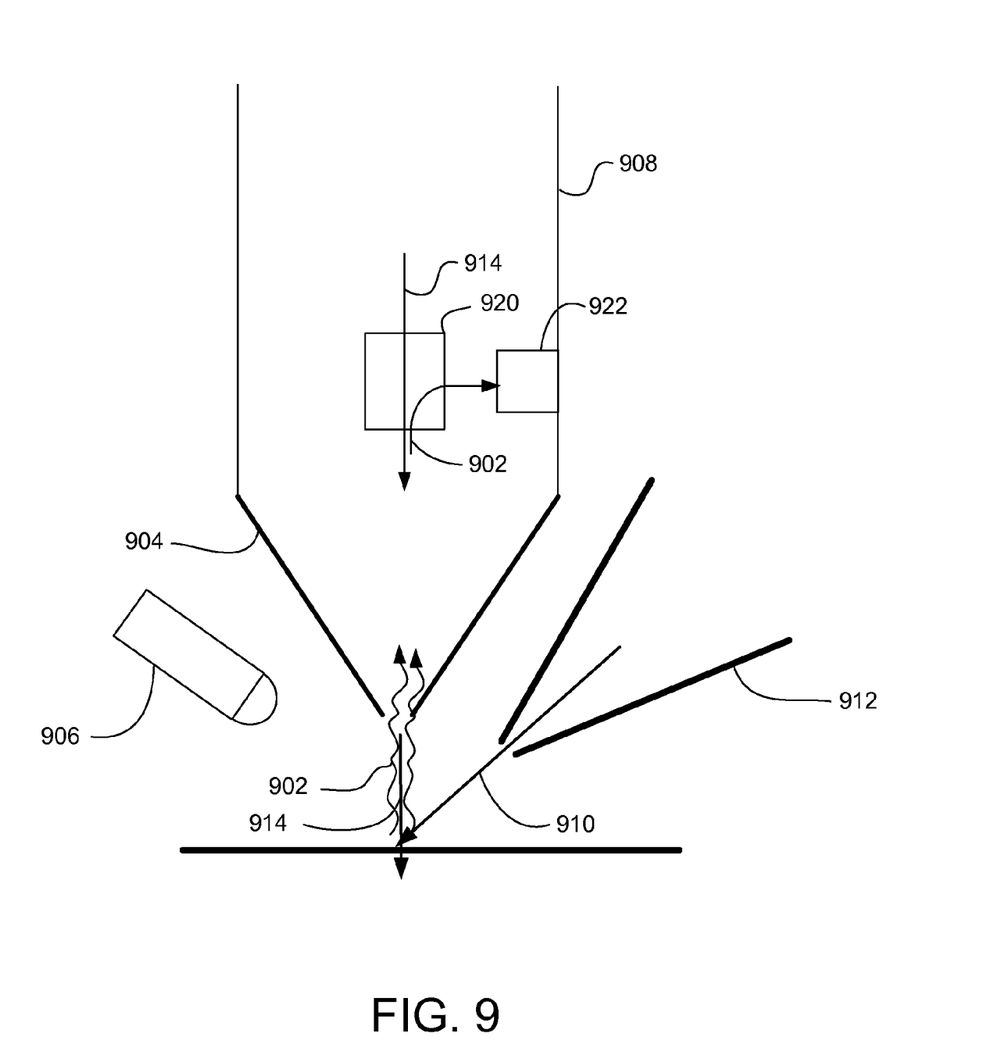
FIG. 9 shows the collection of secondary charged particles in an embodiment of the invention.

FIG. 9 shows the collection of secondary electrons 902 in an embodiment of the invention. Skilled persons will recognize that during operation of an immersion lens 904, it will be impractical to use a conventional FIB secondary electron detector 906, such as a CDEM, because the magnetic field will typically prevent secondary electrons from reaching the detector 906. A "through-the-lens" detector in an electron column 908 can be used to collect and detect secondary electrons generated by an ion beam 910 from a FIB column 912, as well as secondary electrons generated by the primary electron beam 914 during SEM operation. For example, a voltage of a few hundred volts positive relative to the sample, if placed on the SEM objective lens, will attract electrons into the opening of objective lens 904. The electrons will traverse a corkscrew path in the presence of the magnetic field of the immersion lens 904. Electron column 908 includes a deflector, such as a Wien filter 920, that deflects the secondary electrons 902 into a secondary detector 922, while having minimal effect on the primary electron beam 914, which also passes through the Wien filter 920.

Figure 10:
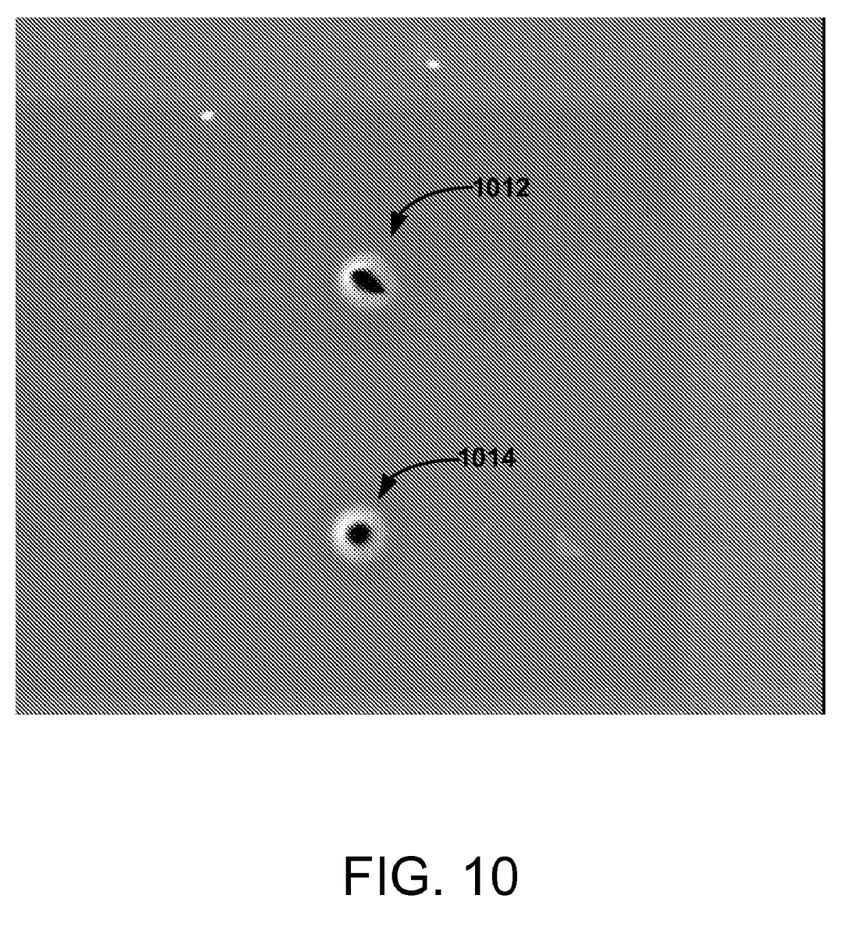
FIG. 10 shows spots created by focused ion beams with and without re-stigmation.

Because the ion beam passes through the magnetic field in a non-symmetric manner causing astigmatism, the beam is preferably re-stigmated, that is, "twisted" to remove stigmation aberration. The beam can be re-stigmated by a quadrupole or octupole used for lower deflectors 538A or 538B (FIGS. 5-8). FIG. 10 shows a spot 1012 milled by an ion beam that was not re-stigmated to remove the aberration and a spot 1014 milled by an ion beam that was restigmated to remove the aberration. FIG. 10 shows that it is desirable to re-stigmate the beam. The magnetic immersion field of the SEM, as well as the new trajectory of the ion beam through the FIB column will create some additional focus error that can be corrected by using new or existing focus correction elements.

Figure 11A:
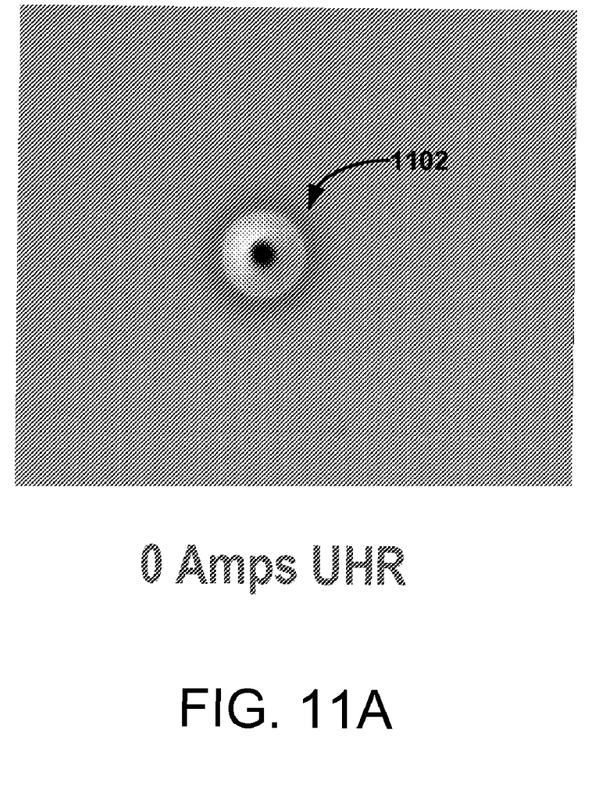
FIGS. 11A and 11B show spots created by focused ion beams in the presence of and in the absence of, respectively, a magnetic field from an immersion lens.
Figure 11B:
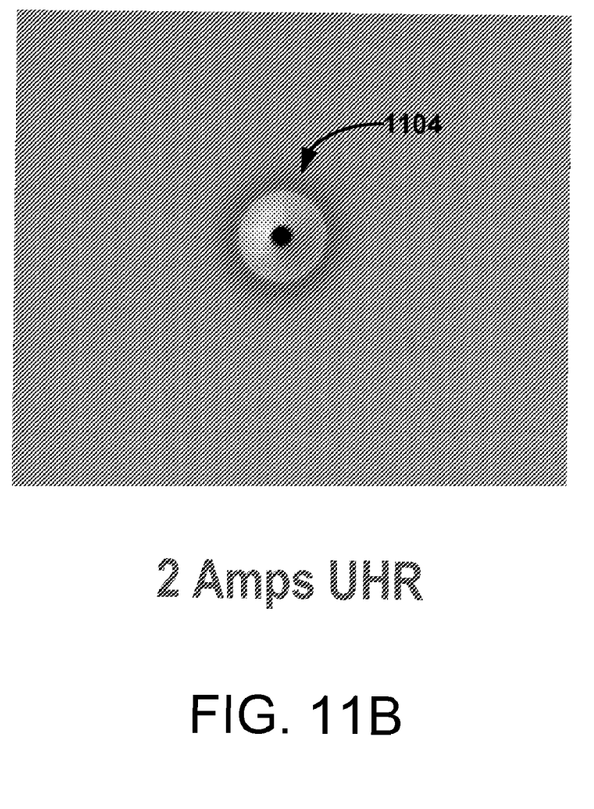

FIGS. 11A and 11B provides a comparison between a spot 1102 milled without a magnetic field from an immersion lens (FIG. 11A), and a spot 1104 milled by a FIB in the presence of the magnetic field of an immersion lens, using an embodiment of the present invention (FIG. 11B). Both spots were milled for 10 seconds using a beam current of 96 pA and a beam energy of 30 keV. The spot 1104 milled in accordance with an embodiment of the invention is no larger than the spot 1102 milled in the absence of a magnetic field, and shows no detectable distortion from circular symmetry.

Figure 12:
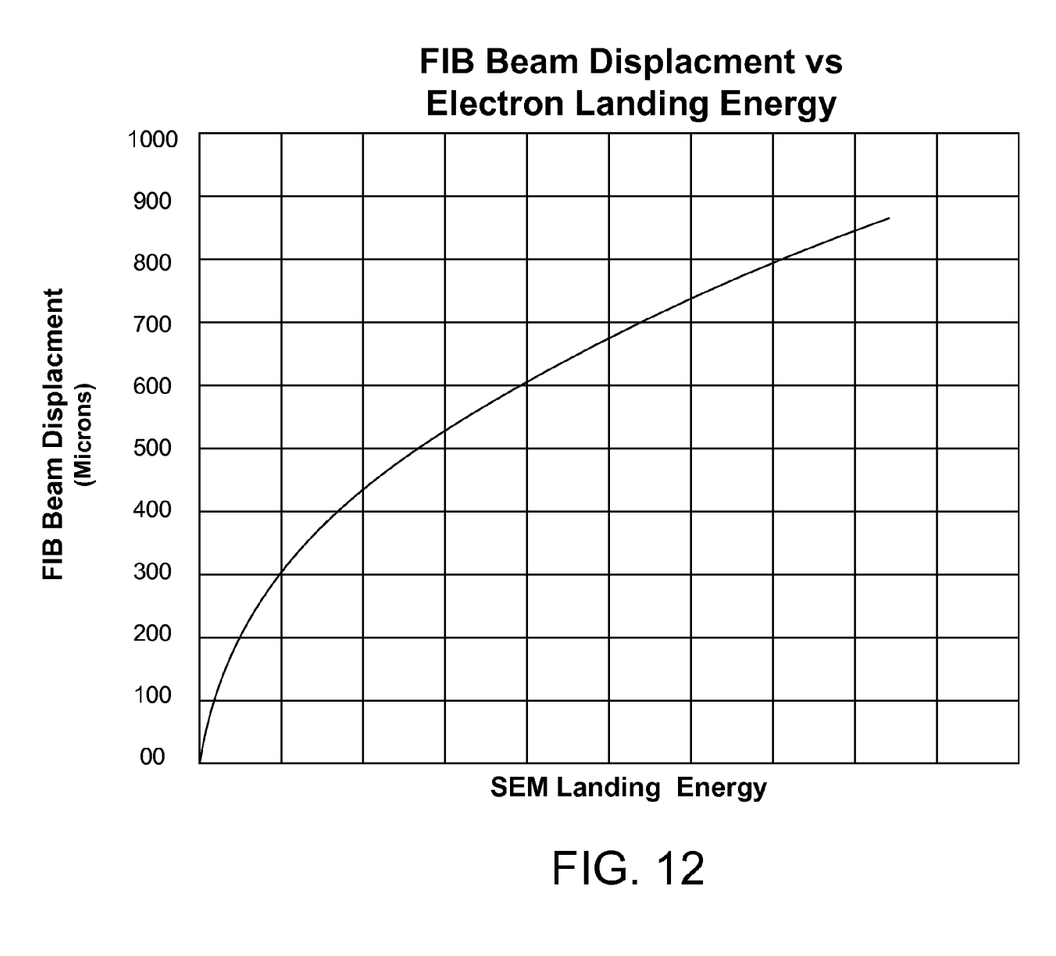
FIG. 12 is a graph showing the relationship between the displacement of the ion beam and the landing energy of the electron beam.

Changing the landing energy of the electrons in the primary beam requires changing the focusing strength of the immersion lens to focus the electrons. Thus, changing the landing energy will result in changing the magnetic field strength of the immersion lens, which will require a corresponding change in the compensating deflection required for the ion beam. As the electron landing energy increases, a stronger magnetic field is required to focus the electron beam, and so greater compensating deflection of the ion beam is required. One can correlate the landing energy of the electrons to the displacement of the FIB beam to predetermine a FIB compensation displacement for any particular electron landing energy. FIG. 12 shows the relation between the landing energy and the FIB spot. Some embodiments of the invention can be simplified by restricting the range of FIB and SEM landing energies, for example, by maintaining the FIB at 30 keV and the SEM at less than 10 keV, as well as limiting the FIB current to for example, about 100 pA. Methods to increase the ion beam deflection include using higher voltage on the deflectors, increasing the working distance, increasing the length of the deflectors, independently controlling the deflectors in the set without placing the pivot point in the plane of the objective lens, or the use of a post-lens deflector.

Changing the FIB landing energy will also change the deflection of the ion beam by the magnetic field and by the compensating electrostatic deflectors. The ion deflection by the magnetic field is approximately proportional to the inverse of the square root of the ion landing energy, while the deflection by an octupole deflector is approximately inversely proportion to the ion landing energy, so the electrostatic deflector is able to provide more compensation as the ion landing energy decreases. The increased deflection, however, increases the chromatic aberration, and so it is preferred to maintain a FIB landing energy of between about 15 keV and 45 keV, and more preferably about 30 keV.

Because the deflection dispersions from the magnetic field are not equal to the deflection dispersion from the electrostatic deflections, the electrostatic deflectors cannot completely eliminate the deflection dispersion. Applicants have found, however, that as the beam current and spot size increase, the deflection dispersion becomes insignificant and undetectable. The reduction in resolution from the dispersion caused by the deflection can be characterized in different ways. One method of characterizing the resolution of an ion beam is to direct the beam toward a surface for a fixed period of time and measure the diameter of the "burn spot." A spot is burned and its diameter measured when the magnetic lens is not operating and then another spot is burned and measured when the magnetic lens is operating and the ion path corrected in accordance with the invention. The degradation of resolution can be determined as an increase in diameter of the burn spot when the magnetic lens is energized and the invention is used, compared to when the magnetic lens is not operating. Embodiments of the invention can achieve an increase in spot size of less than about 50%, 25%, less than about 10%, less than about 5%, or less than about 2%, depending on the beam current and spot size.

For example, in some embodiments, applicants have found that when an ion beam has a spot size greater than about 20 nm, there is an acceptable level of degradation from the deflection. That is, the dispersion is less than about 70% of the spot size. In some embodiments, a spot size greater than 40 nm has very little degradation, that is, dispersion is less than 50% of the spot size, and a spot size of 90 nm or greater has no measurable degradation. Thus, while degradation of the beam may be significant at low beam currents used for imaging, it is insignificant at typical beam currents used for milling and deposition operations. In typical applications, a dispersion of less than about 50% of the ion spot size can be considered to be negligible. The spot size is related to the beam current, and for a beam current of 100 pA, and in some embodiments, less than 50 pA, negligible degradation of the ion spot was observed. As the beam current and spot size are reduced, some degradation may be observed.

The gallium used in a liquid metal ion source is typically found as a mixture of primarily two isotopes, with approximately 60% of the gallium having a mass of about 69 amu and approximately 40% of the gallium having a mass of about 71 amu. Monoisotopic gallium is commercially available for a FIB source and is preferably used with the invention to reduce splitting the beam into two beams.

Because the required beam deflection varies with the ion landing energy and the magnetic field of the immersion lens, and the magnetic field of the immersion lens is varied depending on the desired landing energy of the electrons, one can create tables or analytical relationships to determine the deflection voltage required on the FIB column deflectors for any desired landing energies of the ions and the electrons.

An advantage of some embodiments of the present invention is that simultaneous or near simultaneous interleaved operation of the FIB allows one to determine the end-point of the milling process, for example, by observing repeated imaging, to determine the progress of milling operation. In an interleaved operation, an operator can mill for a period and then cease milling by blanking the FIB. The operator can then increase the current to the immersion lens and obtain an SEM image. The operator can then turn off the current to the immersions lens, and if the image shows that the milling operation is not yet complete, the milling can continue. If the image shows that the milling operation is complete, the operation can stop.

Figure 13:
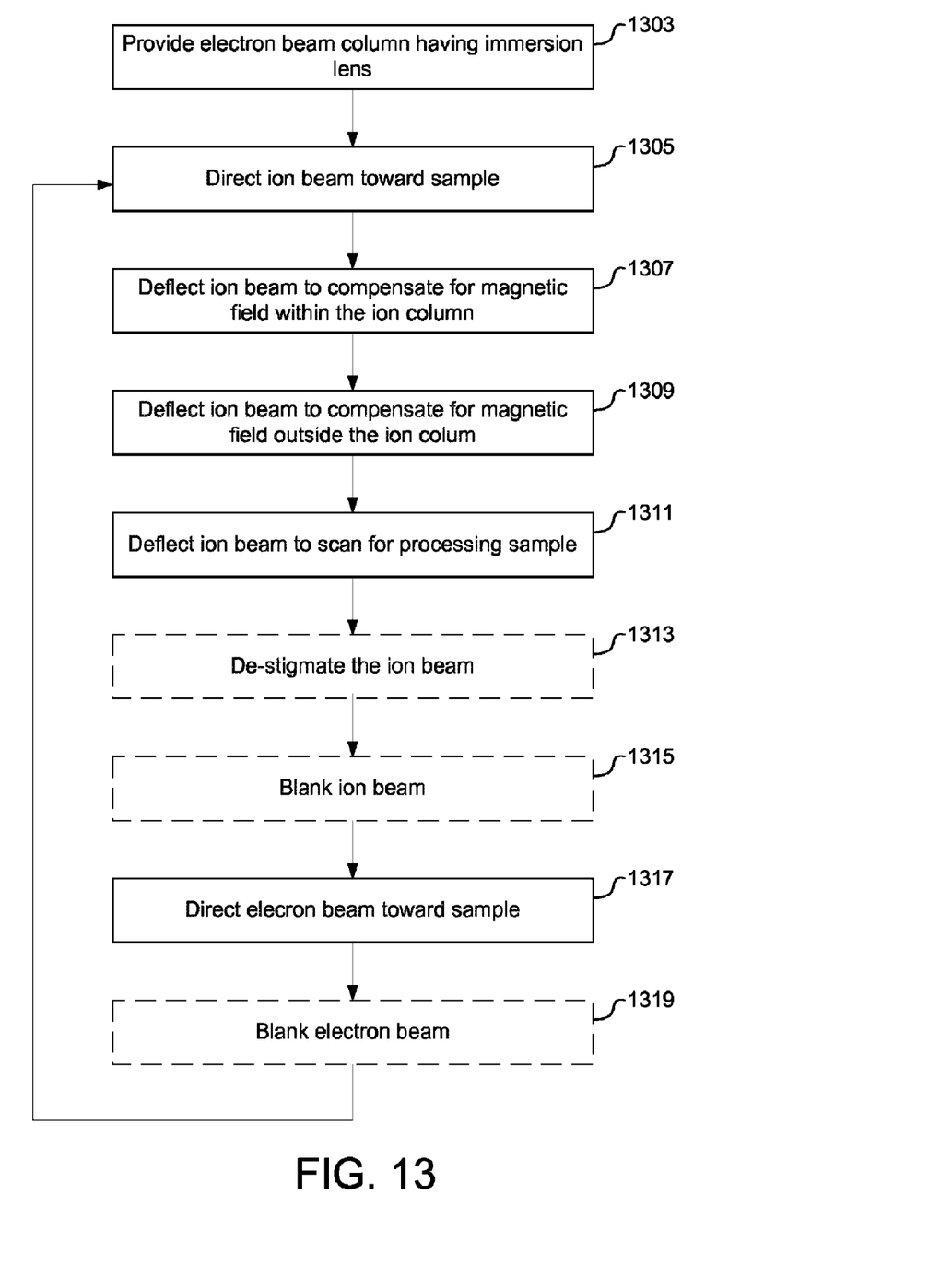
FIG. 13 is a flow chart showing a preferred method of the present invention.

FIG. 13 is a flow chart showing a method in accordance with the present invention. In step 1303, an electron column having an immersion lens is provided. The immersion lens, for example, may produce an magnetic field at the sample surface greater than 0.025 Tesla, greater than 0.05 Tesla, greater than 0.075 Tesla, or greater than 0.1 Tesla. In step 1305, an ion beam is directed toward the sample surface. Ions in the ion beam typically have energy of between 15 keV and 45 keV. In step 1307, the ion beam is deflected to compensate for the magnetic field within the ion column so that the beam will pass at or near the center of the ion objective lens. In step 1309, the ion beam is deflected to compensate for the magnetic field outside the column by deflecting the beam toward the desired impact point. In step 1311, the ion beam is scanned to process the sample. For example, the beam may be rastered for a milling, deposition, or imaging process or the beam may be directed from point to point without rastering. In optional step 1313, the beam is de-stigmated by placing appropriate voltages on a quadrupole or octupole element to eliminate stigmation. Steps 1307, 1309, 1311, and 1313 may be performed simultaneously or sequentially. They may be performed by a single set of deflectors, or by multiple deflectors positioned at different places along the column. Multiple ones of the steps can be performed by a single deflector, and a single one of the steps may be performed by multiple deflectors. In optional step 1315, the ion beam is blanked and in step 1317, an electron beam is directed toward the sample to form a high resolution image. In optional step 1319, the electron beam is blanked, and the process is repeated from step 1305. That is, the sample may be processed by the ion beam, imaged using the electron beam, processed by the ion beam, imaged by the ion beam, and so forth. When either beam is blanked, the corresponding particle source continues to emit charged particles and the corresponding lens stays energized. The beams may be alternated in time periods of less than one second, less than 500 ms, less than 100 ms, less than 10 ms, or less than 1 ms. The electron beam may be directed toward the sample at the same time as the ion beam, without blanking either beam.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. A method of operating a dual beam system, comprising:
providing an electron column for generating an electron beam and focusing an electron beam onto a sample, the electron column including a magnetic objective lens that produces a magnetic field that extends to the sample surface, the magnetic field having a strength of at least 0.025 Tesla at the sample surface; and
directing a focused ion beam toward the sample surface in the presence of the magnetic field, the displacement of the ion beam caused by the magnetic field being compensated for and the compensation increasing the spot size of the beam by less than 50%.

2. The method of claim 1 in which directing a focused ion beam toward the substrate surface includes directing a beam having a spot size of less than 90 nm on the substrate surface.

3. The method of claim 1 further comprising directing an electron beam toward the sample simultaneously with directing the focused ion beam toward the surface.

4. The method of claim 1 further comprising directing an electron beam toward the sample, the electron beam and the ion beam alternating within a period of less than 500 ms.

5. A method of operating a focused ion beam column in the presence of a magnetic field from an electron immersion lens, comprising:
directing a beam of electrons toward a sample, the electrons being focused by a magnetic immersion objective lens having a magnetic field that extends to the sample; and
directing a beam of ions toward a point on the sample surface in the presence of the magnetic field from the electron immersion lens; and
deflecting the beam of ions to compensate for the effect of the magnetic field on the ion beam, the ion beam being directed to process the sample with sub-micron accuracy in the presence of the magnetic field.

6. The method of claim 5 in which deflecting the beam of ions to compensate for the effect of the magnetic field on the ion beam includes deflecting the beam within the ion column to cause the ion beam to traverse the objective lens closer to its center than the ion beam would traverse without compensation in the presence of the magnetic field.

7. The method of claim 5 in which deflecting the beam of ions to compensate for the effect of the magnetic field on the ion beam includes deflecting the ion beam before the beam traverses the objective lens.

8. The method of claim 5 in which deflecting the beam of ions to compensate for the effect of the magnetic field on the ion beam includes deflecting the beam using two deflectors, a first deflector deflecting the beam within the ion column to cause the ion beam to traverse the objective lens closer to its center than the ion beam would traverse without compensation in the presence of the magnetic field and a second deflector compensating for the magnetic field outside of the ion column to move the impact point of the ion beam to where the impact point would be in the absence of the magnetic field.

9. The method of claim 8 in which using the second deflector includes deflecting the ion beam after the beam traverses the objective lens.

10. The method of claim 8 in which deflecting the beam of ions to compensate for the effect of the magnetic field includes dispersing the beam to form a spot on the sample surface than is less than 50% larger than the spot the beam would form in the absence of the magnetic field.

11. The method of claim 8 in which deflecting the beam includes altering the beam to produce a rapid fall off in beam intensity in a first direction and a more gradual fall off in beam intensity in a second direction, normal to the first direction, and further comprising milling a structure including producing a sharp edge using the edge of the beam that falls off rapidly.

12. The method of claim 5 further comprising correcting for stigmation of the ion beam.

13. A dual beam system for processing and imaging microscopic structures on a sample, comprising:
an electron beam column, the column including a magnetic immersion lens for producing a magnetic field that extends to the sample;
an ion beam column, comprising:
a source of ions;
an ion electrostatic objective lens;
a first deflector for compensating for the presence of a magnetic field within the ion column by deflecting the ion beam toward the center of the ion electrostatic objective lens; and
a second deflector for deflecting the ion beam to compensate for the displacement of the ion beam by the magnetic field so that the ion beam impacts the sample at the same position that would be impacted if the immersion lens were not operating.

14. The dual beam system of claim 13 in which the first deflector and the second deflector each comprise an electrostatic deflector.

15. The dual beam system of claim 14 in which the second deflector comprises parallel plate electrodes, quadrupoles, or octupoles.

16. The dual beam system of claim 13 in which the second deflector is positioned before the electrostatic objective lens.

17. The dual beam system of claim 13 in which the second deflector is positioned after the electrostatic objective lens.

18. A dual beam system for processing and imaging microscopic structures on a sample, comprising:
an electron beam column, the column including a magnetic immersion lens that produces a magnetic field that extends to the sample;
an ion beam column, comprising:
an electrostatic objective lens; and
one or more deflectors for deflecting an ion beam, the deflectors having applied thereto voltages to compensate for the deflection of the ion beam by the magnetic field of the immersion lens, such that the spot size of the ion beam is increased by less than 50% by the deflection.

19. The dual beam system of 18 in which the magnetic immersion lens produces a magnetic at the sample surface of greater than 0.05 Tesla.

20. The dual beam system of 18 in which a first one of the one or more deflectors compensates for the magnetic field within the ion beam column by deflecting the ion beam to pass the electrostatic objective lens closer to the center of the electrostatic objective lens and in which a second of the one or more deflectors adjusts the impact point of the ion beam to compensate for the magnetic field outside the ion column.

* * * * *